United States Patent [19]

Pathak et al.

[11] Patent Number: 4,967,256
[45] Date of Patent: Oct. 30, 1990

[54] OVERVOLTAGE PROTECTOR

[75] Inventors: Vijay K. Pathak; Christopher T. Green, both of Bedford, England

[73] Assignee: Texas Instruments Incorporated, Dallas, Tex.

[21] Appl. No.: 216,757

[22] Filed: Jul. 8, 1988

[51] Int. Cl.$^5$ .................... H01L 29/74; H01L 29/72; H01L 29/90
[52] U.S. Cl. ........................................ 357/38; 357/36; 357/13
[58] Field of Search ............... 357/13, 13 LM, 13 PT, 357/13 U, 13 Z, 38, 38 A, 38 C, 38 E, 38 G, 38 L, 38 LA, 38 P, 36

[56] References Cited

U.S. PATENT DOCUMENTS 4,089,024 5/1978 Tanaka ................................. 357/38
4,797,720 1/1989 Lindner ................................ 357/38

FOREIGN PATENT DOCUMENTS 6042846 6/1985 Japan .................................... 357/38
2113907 12/1981 United Kingdom .................. 357/13

Primary Examiner—Rolf Hille
Assistant Examiner—Wael Fahmy
Attorney, Agent, or Firm—William E. Hiller; N. Rhys Merrett; Melvin Sharp

[57] ABSTRACT

An overvoltage protector consists of a 4-layer diode having a buried region located adjacent to the central junction of the diode and of greater impurity concentration than the layer of the same conductivity type adjacent to it, so that the current through the diode preferentially flows through the buried region. The buried region is of smaller area than the emitter junction, so that avalanche multiplication in the buried region determines the breakover current of the diode. The holding current of the diode is set by parts of the second layer which perforate the first layer (emitter) thereby forming a resistive path in parallel with the emitter junction. A device for protecting against voltages of different polarities is decribed comprising two such diodes formed in parallel and connected in opposite senses with a common third layer.

8 Claims, 1 Drawing Sheet

OVERVOLTAGE PROTECTOR

This invention relates to an overvoltage protector.

With the increasing use of semiconductor devices such as transistors and integrated circuits in telephone systems, it has become necessary to provide improved surge or transient suppressor devices for absorbing high voltage electric pulses which become established in the telephone lines so as to avoid their damaging the semiconductor devices.

In British Patent Specification No. 2 113 907 there is described a 4-layer diode (PNPN) semiconductor device which is usable as a transient suppressor because it switches from a high resistance condition to a low resistance condition suddenly when the current through it reaches a threshold value. The invention of that patent lies in the provision of a buried region adjacent to the central junction of the device, which buried region is of the same conductivity type as the region in which it is formed and has a greater impurity concentration than that region. The effect of the buried region is to cause the reverse voltage breakdown through the central junction to take place through the buried region. This enables the breakdown voltage of the device to be controlled more accurately than is the case in a conventional 4-layer diode. Although it is not shown in the above specification the one of the outer layers which acts as the emitter has a number of perforations through it where the material of the adjacent inner layer reaches the surface. The metal contact at the surface produces a resistive short circuit across the junction between the outer and inner layers serving to define the holding current of the device as described below. The provision of these perforations has a negligible effect on the area of the junction.

The ability to control the turn on characteristics of the device described in the above patent specification not only improves the system protection which the device can provide but in certain applications can also improve the power dissipation capability of the device. As the voltage applied across the device increases reverse voltage breakdown starts to occur at the central junction and when the current through that junction reaches 1 mA the voltage across the junction is defined as Vz, the breakdown voltage of the junction. The reverse breakdown voltage Vz of the central junction of the device is primarily determined by the impurity concentration of the buried region. Further increase in the applied voltage causes the device to break over to its turned on state when the voltage drop across the shorted emitter junction exceeds 0.6 volts. At this point the sum of the current gains of the two transistors into which the device can notionally be divided exceeds unity, and the regenerative connection of the transistors causes the device to trigger into its low resistance state. The voltage at which the transition from high resistance to low resistance, or turning on, of the device takes place is the breakover voltage Vbo and is characterised by a breakover current Ibo. When the voltage transient which caused the device to be turned on has passed, the device reverts to its off state and the current at which the transition from the on state to the off state occurs is called the holding current Ih which is determined by the lateral resistance of the second layer of the device, the layer next to that in which the buried region is formed. The holding current Ih is indicative of the condition that the sum of the current gains of the two component transistors of the device becomes less than unity.

For use in different applications transient suppressors need to have different values of breakover voltage Vbo, breakover current Ibo and holding current Ih. However, changes in the manufacturing processes or the design which affects the lateral resistance of the second layer affects both Ibo and Ih and has very little effect on the relationship between them which limits undesirably the flexibility of the properties of the suppressors and the protection which they can provide.

It is an object of the present invention to provide an overvoltage protection device in which these disadvantages are overcome.

According to a first aspect of the present invention there is provided a 4-layer diode usable as an overvoltage protector having first and third layers of a first conductivity type semiconductor material, second and fourth layers of a second conductivity type semiconductor material and a buried region of the first conductivity type in the third layer adjacent to the central junction between the second and third layers, the buried region having a greater impurity concentration than the third layer so that reverse breakdown of the central junction preferentially occurs through the buried region, wherein the area of the buried region is substantially smaller than the area of the junction between the first and second layers.

According to a second aspect of the present invention there is provided a 4-layer diode usable as an overvoltage protector having a buried region adjacent the central PN junction, the buried region being of the same conductivity type as and having a greater impurity concentration than the layer of the diode in which it is located so that reverse breakdown of the central PN junction preferentially occurs through the buried region, wherein the area of the buried region is such that when the diode is conducting the current density through the buried region is substantially higher than that through each of the other junctions of the diode.

The buried region is preferably compactly shaped and centrally located in the current stream through the diode.

A combined device having the same voltage/current characteristics for positive and negative, and consisting of two 4-layer diodes according to the invention connected in parallel but in opposite directions and sharing a common third layer may be provided. Such a device may be produced by diffusion or ion implantation into opposite major faces of a substrate which forms the common third layer.

In order that the invention may be fully understood and readily carried into effect it will now be described with reference to the accompanying drawings, of which:

The examples of the invention to be described are in many respects similar to those described in the above-mentioned British Patent No. 2 113 907 and the methods of fabricating the devices and the impurity concentrations mentioned in that specification could also be used for devices according to the present invention.

Figure 1:
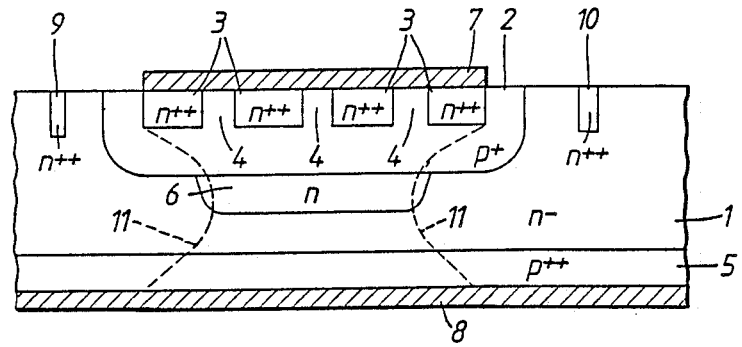
FIG. 1 is a cross-sectional diagram of one example of a device according to the invention.

The example of the invention shown in FIG. 1 consists of a substrate 1 of N-type conductivity silicon having a relatively low impurity concentration. In the upper surface of the substrate 1 is formed a region 2 of P-type conductivity of relatively high impurity concentration and in the region 2 is formed a region 3 of N-type conductivity having a very high impurity concentration. The region 3, which may be referred to as the emitter of the device, is penetrated by a number of holes 4 through which the P-type material of the region 2 extends to the surface. On the lower face of the substrate 1 is formed a fourth region 5 of P-type conductivity having a very high impurity concentration. A buried region 6 of N-type conductivity is formed beneath the centres of the regions 2 and 3 in the material of the substrate 1, the region 6 having a higher concentration of impurity than the substrate itself. Metallisation 7 is applied to the upper surface of the substrate over the region 3 so as to connect to that region and to the region 2 through the holes 4. Metallisation 8 extending over the entire lower surface of the layer 5 is provided by soldering the semiconductor body on to a metal support. A guard ring of very highly doped N-type material indicated by the references 9 and 10 is formed around the region 2 in the upper surface of the substrate 1.

The buried region 6 could be formed by diffusion or ion beam implantation of an N-type impurity through the upper surface of the substrate 1 before the regions 2 and 3 are formed. The concentration of the impurity used to form region 2 is chosen to be sufficiently high to convert the upper part of the N-type region formed by the first diffusion or ion implantation used to form the region 6 to P+-conductivity. Similarly the diffusion or ion implantation used to form the region 3 must use an impurity concentration sufficient to convert the P+-material of the region 2 to N++-conductivity type material. The fourth region 5 may be formed by diffusion or ion implantation through the lower surface of the substrate 1 or possibly by epitaxial deposition.

Figure 3:
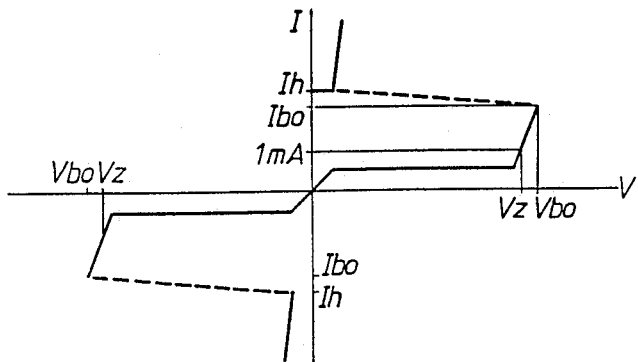
FIG. 3 shows the voltage/current characteristic of the device of FIG. 2.

Apart from the provision of the holes 4 through the region 3 and the relatively small size of the buried region 6, the example of the invention shown in FIG. 1 is similar to that shown in FIG. 3 of British Patent Specification No. 2 113 907. The purpose of the holes 4 through the region 3 is to provide a resistive connection across the junction between the regions 3 and 2. This resistive connection serves to determine the holding current Ih of the device because for the device to be of low impedance the forward voltage across the junction between the regions 3 and 2 must be at least about 0.6 volts.

In operation the device shown in FIG. 1 behaves as two bipolar transistors connected in a regenerative loop. One transistor is formed by the regions 3, 2 and 6 and is of NPN-type and the other transistor is formed by regions 2, 1 and 5 and is of PNP-type. In the operation of the device the current gains of the two transistors are dependent on the currents through them, the current gains increasing as the currents increase. When the sum of the current gains of the two transistors reaches unity the regenerative connection of the two transistors causes the device to switch from a relatively high resistance state to a very low resistance state, this transition being the turning on of the device. When in the low resistance state the current flows from the metallisation 8, the anode contact, through the regions 5 into the substrate 1 and from there through the regions 6, 2 and 3 to the metallisation 7 which forms the cathode contact of the device. The higher impurity concentration of the buried region 6 causes the current to flow preferentially through this region because avalanche multiplication occurs more readily at the junction between the region 2 and the region 6 than at the junction between the region 2 and the substrate 1. Because of the relatively small size of the buried region 6 the current density through this region is higher than that through the junction between the regions 3 and 2, the current paths being constrained within the dashed lines 11. The effect of the increased current density between the regions 2 and 6 means that the breakover current Ibo of the device is smaller than it would be if the buried region 6 had been of larger area. This change in the area of the buried region 6 has no effect on the holding current Ih of the device because this is determined by the lateral resistance of the material of the region 2 as mentioned above. Therefore by selecting the size of the diffusion or ion implantation used to form the region 6 it is possible to adjust the relationship between the breakover current Ibo and the holding current Ih.

The degree of control of the breakover current Ibo by the adjustment of the area of the buried region 6 depends on the density of the emitter shorting holes 4 through the region 3, the control being more sensitive to change in the area of the buried region 6 for a lower density of larger emitter shorting holes.

Experimental examples of the device according to the invention have shown an approximately linear relationship between the area of the buried region and the value of the breakover current Ibo. Halving the area of the region 6 resulted in a reduction in Ibo of 35%. Typically, the buried region has an area of 12½–80% of that of the emitter junction, although values outside this range could be used for special purposes. The decrease in the breakover current Ibo with reduction in the area of the region 6 is also affected by the size of the holes 4 through the region 3; the larger the size of the holes 4 the greater is the decrease in the breakover current Ibo for a given reduction in the area of the region 6. The control of the breakover current Ibo achieved in this manner allows the production of a protection device having an extremely low breakover current Ibo, which is not prone to spurious triggering as are devices made to have similar breakover currents Ibo by conventional techniques.

The present invention provides devices having a number of advantages over those disclosed in the above-mentioned British patent specification by virtue of the ability to vary the relationship between the breakover current Ibo and the holding current Ih which, as explained above, is fixed in the prior art devices. Since the devices according to the present invention can have a lower breakover current Ibo than the prior art devices, they will also have a lower breakover voltage Vbo and can offer better protection because of the reduced breakover voltage Vbo to reference voltage Vz ratio giving a lower voltage overshoot under surge conditions.

A problem which can be encountered in telephone lines when they pass close to power supply lines is that a substantial alternating voltage can be induced into the telephone lines and to prevent this induced voltage from damaging the semiconductor devices in the telephone system it is necessary for the protector to be able to block high voltage pulses of both polarities. The power dissipation of a device according to the present invention when used to absorb an alternating voltage can be controlled by the use of a device having an optimum breakover current Ibo and this can reduce the demands made on a further protection device such as a fuse or positive temperature coefficient resistor in series with the suppressor device.

Figure 2:
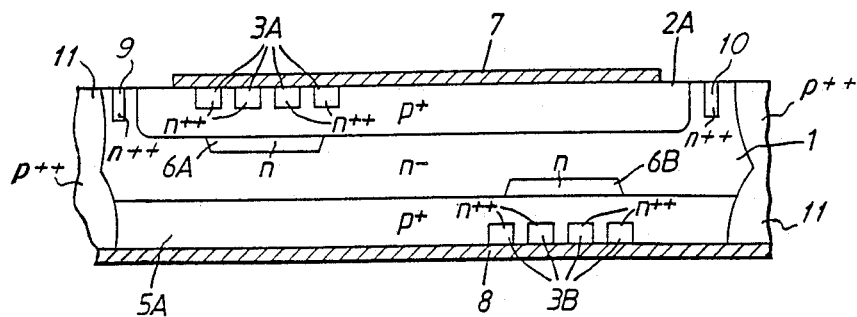
FIG. 2 is a cross-sectional diagram of another example of a device according to the invention.

When used for protection against pulses of differing polarity, the single device described above with reference to FIG. 1 suffers from the disadvantage that it is effective only on the forward current, the reverse current through the device being limited by the avalanche breakdown of the two outer junctions. In order to overcome this difficulty a device having two parts each similar to the device of FIG. connected to give a symmetrical characteristic can be used and an example of this is shown in FIG. 2. In FIG. 2 the same reference numerals are used for elements which correspond to those used in FIG. 1. From a consideration of FIG. 2 it will be apparent that the device shown has a left-hand part which corresponds in structure to the example shown in FIG. 1 and the right-hand part is of the same structure but inverted. These two devices are connected in parallel with one another between the metallisations 7 and 8. As in FIG. 1 the metallisation 8 extends over the entire lower surface of the device, it being provided by the soldering of the semiconductor body on to a metal support. Isolation diffusions are made into both surfaces to produce a surrounding ring of very highly doped P-type conductivity material.

The operation of the device shown in FIG. 2 is the same as that of the device shown in FIG. 1 for each polarity of pulses applied to the device, the two parts of the device handling a respective polarity of pulse. The voltage/current characteristic of the device of FIG. 2 is shown in FIG. 3.

Although the invention has been described with reference to examples having regions of particular conductivity types it will be apparent that devices could also be made using opposite conductivity types, although the use of the conductivity types shown does facilitate some of the processes needed to fabricate the device.

The steep increase of current gain with the magnitude of the current flowing through it as mentioned above in connection with the change in conductivity state of a 4-layer diode does not allow a device using germanium as the semiconductor to stably maintain the high resistance state without special measures to control the current through it, and therefore devices according to the invention may only with difficulty be made using germanium as the semiconductor. Devices according to the invention are preferably made using silicon and may possibly be made with other semiconductors as well.

We claim:

1. A semiconductor device comprising:
   a substrate of semiconductor material having a body portion of one conductivity type provided with a top surface and a bottom surface;
   a first region of the other conductivity type disposed in said body portion and opening into the top surface thereof;
   said body portion of said one conductivity type and said first region of said other conductivity type defining a first PN junction interface therebetween;
   a second region of said one conductivity type disposed in said first region of said other conductivity type and opening onto the top surface of said body portion;
   said first region of said other conductivity type and said second region of said one conductivity type defining a second PN junction interface therebetween;
   said first PN junction interface being of greater area than the area of said second PN junction interface;
   a third region of said other conductivity type disposed on the bottom surface of said body portion of said one conductivity type;
   a single buried region of said one conductivity type disposed in said body portion and opening onto said first PN junction interface between said body portion and said first region to define a composite PN junction interface therewith in which the interface between said buried region of said one conductivity type and said first region of said other conductivity type defines a PN junction forming a portion of the total composite PN junction interface;
   said buried region of said one conductivity type having a higher dopant impurity concentration than that of said body portion of said one conductivity type; and
   the PN junction interface between said buried region of said one conductivity type and said first region of said other conductivity type being of substantially smaller area than the area of said second PN junction interface;
   whereby reverse breakdown of said composite PN junction interface preferentially occurs through said buried region of said one conductivity type.

2. A semiconductor devices as set forth in claim 1, wherein the area of said PN junction interface between said buried region of said one conductivity type and said first region of said other conductivity type is in a range between 12½ and 80% of the area of said second PN junction interface.

3. A semiconductor devices as set forth in claim 1, wherein the area of said PN junction interface between said buried region of said one conductivity type and said first region of said other conductivity type is directly proportional to the magnitude of a breakover current flowing through the semiconductor device required to cause avalanche multiplication in the buried region of said one conductivity type.

4. A semiconductor device as set forth in claim 1, wherein said buried region of said one conductivity type is centrally located with respect to said first region of said other conductivity type and said second region of said one conductivity type.

5. A semiconductor device as set forth in claim 1, wherein said second region of said one conductivity type is penetrated by distributed small portions of the material of said first region of said other conductivity type extending to the top surface of said body portion; and
   a metallization layer disposed on the top surface of said body portion and connecting said small portions of the material of said first region of said other conductivity type with said second region of said one conductivity type, wherein said small portions of the material of said first region of said other conductivity type provide a resistive connection in parallel with said second PN junction interfaces between said first region of said other conductivity type and said second region of said one conductivity type.

6. A semiconductor device as set forth in claim 1, wherein said body portion, said second region and said buried region are of N-type conductivity and said first region and said third region are of P-type conductivity.

7. A semiconductor device as set forth in claim 1, wherein said body portion, said second region and said buried region are P-type conductivity and said first region and said third region are of N-type conductivity.

8. A voltage overstress protection device including two semiconductor devices as set forth in claim 1, formed in the same substrate of semiconductor material;
   one of said two semiconductor devices being formed in said substrate with reference to one of the major surfaces of said substrate defining the top surface thereof;
   the other of said two semiconductor devices being formed in said substrate in the opposite sense such that the other of the major surfaces of said substrate is the top surface thereof;
   said body portion of said one conductivity type of said substrate being common to each of said two semiconductor devices;
   said first region of said other conductivity type of one of said two semiconductor devices being said third region of said other conductivity type of the other of said two semiconductor devices; and
   said third region of said other conductivity type of said one of said two semiconductor devices being said first region of said other conductivity type of said other of said two semiconductor devices.

* * * * *